United States Patent
Drost et al.

(10) Patent No.: US 11,121,282 B2
(45) Date of Patent: Sep. 14, 2021

(54) METHOD FOR PRODUCING A CDTE THIN-FILM SOLAR CELL

(71) Applicants: CHINA TRIUMPH INTERNATIONAL ENGINEERING CO., LTD., Shanghai (CN); CTF SOLAR GMBH, Dresden (DE)

(72) Inventors: Christian Drost, Dresden (DE); Sven Frauenstein, Dresden (DE); Michael Harr, Dresden (DE); Shou Peng, Shanghai (CN)

(73) Assignees: CHINA TRIUMPH INTERNATIONAL ENGINEERING CO., LTD., Shanghai (CN); CTF SOLAR GMBH, Dresden (DE)

( * ) Notice: Subject to any disclaimer, the term of this patent is extended or adjusted under 35 U.S.C. 154(b) by 258 days.

(21) Appl. No.: 16/064,636

(22) PCT Filed: Dec. 27, 2016

(86) PCT No.: PCT/CN2016/112423
§ 371 (c)(1),
(2) Date: Jun. 21, 2018

(87) PCT Pub. No.: WO2018/119682
PCT Pub. Date: Jul. 5, 2018

(65) Prior Publication Data
US 2021/0210650 A1 Jul. 8, 2021

(51) Int. Cl.
*H01L 31/0445* (2014.01)
*H01L 31/18* (2006.01)
*H01L 31/0224* (2006.01)
*H01L 31/0296* (2006.01)
*H01L 31/0392* (2006.01)

(52) U.S. Cl.
CPC ...... *H01L 31/1828* (2013.01); *H01L 31/0296* (2013.01); *H01L 31/022466* (2013.01); *H01L 31/03925* (2013.01); *H01L 31/0445* (2014.12); *H01L 31/1872* (2013.01); *H01L 31/1884* (2013.01)

(58) Field of Classification Search
CPC ............ H01L 31/1828; H01L 31/0445; H01L 31/022466; H01L 31/0296; H01L 31/03925; H01L 31/1872; H01L 31/1884
USPC .................................................. 136/255, 256
See application file for complete search history.

(56) References Cited

U.S. PATENT DOCUMENTS

| | | | | |
|---|---|---|---|---|
| 2009/0020149 A1* | 1/2009 | Woods | ................ | H01L 31/0336 136/244 |
| 2013/0174895 A1* | 7/2013 | Compaan | .............. | H01L 31/076 136/255 |
| 2015/0000733 A1* | 1/2015 | Buller | ................. | H01L 31/0749 136/256 |
| 2015/0221812 A1* | 8/2015 | Reese | ............... | H01L 21/02562 136/256 |

* cited by examiner

*Primary Examiner* — David Vu
*Assistant Examiner* — Brandon C Fox
(74) *Attorney, Agent, or Firm* — Global IP Services; Tianhua Gu

(57) ABSTRACT

The present invention describes a method for producing CdTe thin-film solar cells, in which special parameters of different processing steps and a special sequence of processing steps result in improved characteristics of the produced CdTe solar cells.

14 Claims, 3 Drawing Sheets

METHOD FOR PRODUCING A CDTE THIN-FILM SOLAR CELL

FIELD OF THE INVENTION

The subject of the present application is a method for producing a CdTe thin-film solar cell with a special sequence of processing steps having special process parameters.

BACKGROUND OF THE INVENTION

In the state of the art, a CdTe solar cell is produced with the following process sequence: on a glass substrate, a transparent conducting oxide layer (TCO) is deposited as a front contact. The TCO layer can include a high resistive buffer layer which helps to minimize the shunting effect in solar cell. On this, a layer of cadmium sulfide (CdS) and, on top of that, a layer of cadmium telluride (CdTe) is deposited. The CdTe layer is then activated with an activating agent, e.g. $CdCl_2$, and a temperature treatment step. Finally a metal layer, e.g. of molybdenum, nickel vanadium, tantalum, titanium, wolfram, gold or any composition or compound comprising one of these elements, is applied as a back contact to collect the charge carriers. This process is called superstrate configuration.

For achieving a high efficiency of the solar cell, a good ohmic contact between the CdTe layer and the metal layer should be established. To this end, copper may be introduced into the CdTe layer in a region at the interface to the metal layer. The copper may be provided to the CdTe layer as an elemental layer comprising only copper or as a dopant contained in another material or as an ion or as a part of a chemical compound. The copper may be applied on the CdTe layer, for instance, from a gas, e.g. by sputtering, or from an aqueous solution, e.g. of copper chloride or another copper salt. A temperature treatment may be performed after applying copper on the CdTe layer. In prior art, any process for introducing copper into the CdTe layer is called a copper treatment step, which is usually performed after the activating step and before applying a metal layer as a back contact.

However, copper easily migrates within the CdTe and may thus degrade the characteristics of the CdTe solar cell over time. Therefore, it is very important to accurately control the amount and position of copper introduced into the CdTe layer in order to achieve a good ohmic contact and simultaneously reduce the risk of copper migration. This can be done by controlling, for instance, the copper concentration in an aqueous solution or the time for which an aqueous solution is provided to the CdTe layer or the thermal budget of the temperature treatment step defined by temperature and duration of this step. Unfortunately, some of these parameters may not be controlled as exactly as it would be necessary.

Furthermore, there are other parameters, like the material or the thickness of the different layers, or further steps, like an artificial aging step including illumination or electric biasing after applying all layers of the solar cell, which may be affected or included in order to improve the electric characteristics of the produced CdTe solar cell.

SUMMARY OF THE INVENTION

The object of the present invention is to provide a method for producing a CdTe thin film solar cell which method further improves the electric characteristic of the produced solar cell.

According to the invention, the object is achieved using the method according to claim 1. Advantageous embodiments are disclosed in the corresponding dependent subclaims.

The method according to the application comprises the following steps:
Providing a transparent substrate with a transparent conducting layer as a front contact on it,
Applying a CdS layer on the transparent conducting layer using closed space sublimation (CSS) technique, wherein the CdS layer is applied with a thickness in the range between 20 nm to 40 nm,
Applying a CdTe layer on the CdS layer using CSS technique, wherein the CdTe layer is applied with a thickness in the range between 3 μm and 5 μm,
Applying a crystalline layer of $CdCl_2$ with a thickness in the range of 50 nm to 100 nm on a first surface of the CdTe layer,
Performing a first temperature treatment step after applying the $CdCl_2$ layer at a temperature in the range of 380° C. to 430° C. for a time in the range of 15 minutes to 45 minutes under atmospheric conditions,
Performing a first cleaning step after the first temperature treatment step, wherein the layer stack resulting from the previous processing steps is dipped into a solution of diammonium hydrogen citrate with a concentration in the range of 0.1% to 50% for a time in the range of 15 seconds to 5 minutes,
Applying a back contact layer on the first surface of the CdTe layer after the first cleaning step, wherein the back contact layer is applied with a thickness in the range of 200 nm to 400 nm and comprises molybdenum,
Providing copper ions to a first surface of the back contact layer by dipping a layer stack resulting from the previous process steps into a $CuCl_2$ solution with a concentration in the range of 0.05 mmol/l to 1 mmol/l for a time in the range of 30 seconds to 2 minutes,
Performing a second temperature treatment step after removing the layer stack from the $CuCl_2$ solution at a temperature in the range of 180° C. to 250° C. for a time period with a duration in the range of 10 minutes to 45 minutes under atmospheric conditions,
Performing an artificial aging step after performing the second cleaning step, wherein the artificial aging step includes an illumination of the layer stack resulting from the previous process steps for a time in the range of 1 minute to 48 hours with an illuminance in the range of 5000 lx to 200000 lx at a temperature in the range of 70° C. to 80° C. under atmospheric conditions, and
Performing a second cleaning step after performing the artificial aging step, wherein the layer stack resulting from the previous processing steps is cleaned by dipping the layer stack into a dimethylformamide solution with a concentration in the range of 50% to 100% for a time in the range of 1 minute to 10 minutes and subsequently rinsed with water and isopropanol.

Inventors surprisingly found that the mentioned special parameters of the individual steps and the special processing sequence (in particular the mentioned thin CdS layer, providing copper to the CdTe layer after applying the back contact layer, performing an artificial aging step after a temperature treatment step following providing copper and especially the mentioned cleaning steps) result in solar cells having very high efficiency for CdTe cells (η higher than 17%) and other very good electrical characteristics, e.g. open circuit voltage ($V_{oc}$), fill factor (FF) and short-circuit current ($J_{sc}$), which could not be achieved with a process sequence having only a part of the described steps or in another sequence or other parameters of the steps (like layer thickness, solution concentration, temperature and time).

The transparent conducting layer, the CdS layer, the CdTe layer as well as the back contact layer may be applied or provided using techniques known from the prior art. The transparent conducting layer and the back contact layer may be layer stacks comprising different layers made of different materials. For instance, the transparent conducting layer may contain a layer of a transparent conducting oxide, e.g. indium tin oxide (ITO) or cadmium stannate (CTO, $Cd_2SnO_4$), and a high-resistive buffer layer, e.g. of zinc stannate (ZTO, $Zn_2SnO_4$). The transparent conducting layer or the back contact layer may be applied using evaporation, sputtering, chemical vapor deposition or pyrolysis, whereas the back contact layer may be formed by sputtering, evaporation or chemical vapor deposition.

The CdS layer is preferably applied with a thickness of 30 nm, whereas the CdTe layer is preferably applied with a thickness of 4 μm.

The $CdCl_2$ is preferably applied as an aqueous salt solution by roller coating, wherein, after evaporation of the water, a crystalline $CdCl_2$ layer results which preferably has a thickness of 80 nm. The aqueous solution preferably has a concentration in the range of 20% to 30%, in particular of 25%. The $CdCl_2$ may also be applied as a methanolic salt solution or as a mixed aqueous and methanolic salt solution. A semi-finished CdTe solar cell comprising the transparent substrate, the transparent conducting layer, the CdS layer and the CdTe layer is preferably held at a temperature of about 60° C. during applying the $CdCl_2$ solution.

The first temperature treatment step is preferably performed at a temperature of 410° C. for 25 minutes.

Preferably, a 1%-solution of diammonium hydrogen citrate (DAHC) is used for the first cleaning step, which is performed for a time of 1 minute.

The back contact layer is preferably made of molybdenum and is preferably applied with a thickness of 300 nm.

A 0.1 mmol/l solution of $CuCl_2$ is preferably used for providing copper ions to the first surface, wherein the layer stack is dipped into this solution for 1 minute.

The second temperature treatment step is preferably performed at a temperature of 200° C. for 15 minutes.

In a preferred embodiment, a further cleaning step is performed after the second temperature treatment step and before the artificial aging step, wherein the layer stack resulting from the previous processing steps is cleaned by dipping the layer stack into a solution of dimethylformamide (DMF) with a concentration in the range of 50% to 100% for a time in the range of 1 minute to 10 minutes. The further cleaning step is preferably performed with a 100% solution of dimethylformamide for 5 minutes.

During the artificial aging step, the layer stack is preferably held at a temperature of 75° C., while it is illuminated with an illuminance of about 35000 lx for 48 hours. This illuminance results, for instance, from a halogen lamp having a luminous flux of about 8500 lm, wherein the lamp is arranged with a distance of 30 cm to the layer stack and illuminates an area of the layer stack of about 100 $cm^2$. The time for which the artificial aging step is performed dependence on the used illuminance, wherein higher illuminance allows shorter time of illumination.

Preferably, the second cleaning step is performed with a 100% solution of dimethylformamide (DMF) for 5 minutes.

The cleaning steps and the temperature treatment steps are performed at atmospheric conditions, which mean that normal air at normal pressure (around 101.325 kPa) is given during these steps instead of a special gas atmosphere or vacuum, for instance.

BRIEF DESCRIPTION OF THE DRAWINGS

The accompanying drawings are included to provide a further understanding of the invention and are incorporated in and constitute a part of this specification. The drawings illustrate an embodiment of the present invention and together with the description serve to explain the principles. Other embodiments of the invention are possible and lie within the scope of the invention. The elements of the drawings are not necessarily to scale relative to each other. Like reference numbers designate corresponding similar parts.

DETAIL DESCRIPTION OF THE INVENTION

Figure 1:
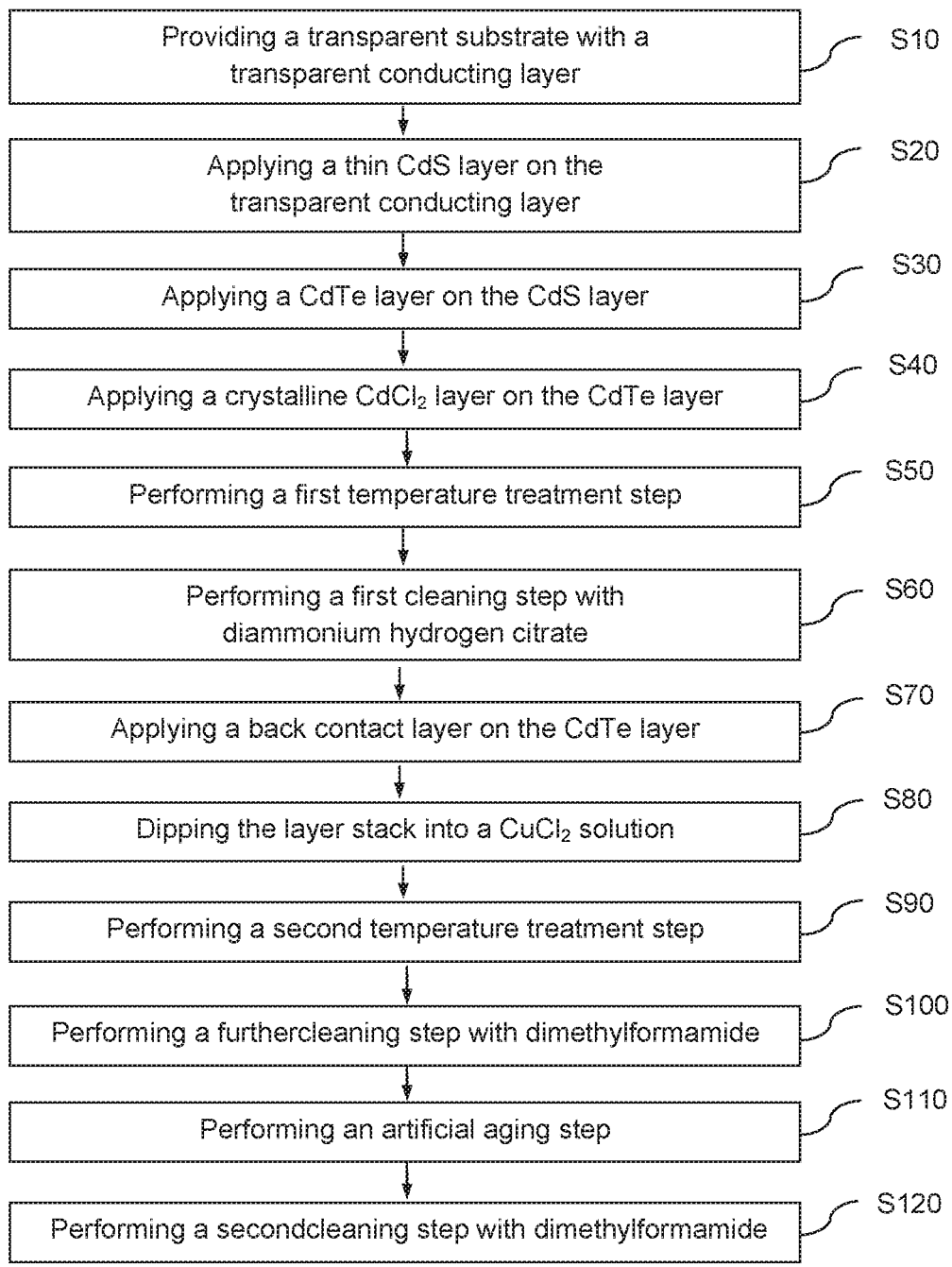
FIG. 1 schematically shows the sequence of process steps according to an embodiment of the method of the application.

The exemplary embodiment of the method according to the application shown in FIG. 1 starts with providing a transparent substrate made of glass with a transparent conducting layer made of ITO on it (S10), wherein the transparent conducting layer serves as a front contact of the CdTe solar cell which will be produced.

On the transparent conducting layer, a 30 nm thick CdS layer is applied using closed space sublimation (CSS) technique (S20). The low thickness of the CdS layer is important for achieving good characteristics of the produced CdTe solar cell. However, the thickness cannot be reduced in any order due to other process steps, in particular to the activation step and temperature treatment steps, and due to the necessity to prevent microshunts or pinholes within the CdS layer. Therefore, 30 nm has been found by the inventors to be the best choice.

On the CdS layer, a 4 μm thick CdTe layer is applied using CSS technique (S 30).

Thereafter, a 80 nm thick crystalline layer of $CdCl_2$ is applied on a first surface of the CdTe layer by roller coating using an aqueous $CdCl_2$ solution of 25%, wherein the semi-finished CdTe solar cell comprising the previous mentioned layers on the transparent substrate is held at a temperature of 60° C. (S40). The thickness of the $CdCl_2$ layer should be controlled very precisely, since the amount of chloride ions should be sufficient to activate the recrystallization of the CdTe layer and yet small enough to limit a degradation of the CdS layer, e.g. a delamination of the CdS layer. The first surface of the CdTe layer is that surface which lies free, i.e. it is that surface which does not adjoin to the CdS layer. The layer of $CdCl_2$ is applied at room temperature, which is a temperature in the range between 15° C. and 30° C., usually around 20° C.

After applying the $CdCl_2$ layer, a first temperature treatment step is performed (S50). The layer stack resulting from the previous steps, i.e. with the $CdCl_2$ layer on top of it, is held at a temperature of 410° C. for a time of 25 minutes under atmospheric conditions. This temperature and time in connection with the amount of $CdCl_2$ applied in step S40 is sufficient for achieve a good recrystallization of the CdTe layer without largely dissolving or degrading the CdS layer.

Subsequently, a first cleaning step is performed, wherein the layer stack resulting from the previous processing steps is dipped into a 1%-solution of diammonium hydrogen citrate for a time of 1 minute (S60). This step serves for removing residuals of the $CdCl_2$ layer from the first surface of the CdTe layer, wherein the inventors found that diammonium hydrogen citrate and the used parameters are most suitable and give the best results.

Following first cleaning step, a 300 nm thick back contact layer made of molybdenum is applied on the first surface of the CdTe layer using sputtering according to the prior art (S70).

After terminating the step of applying the back contact layer, the layer stack resulting from the previous process steps is dipped into an aqueous 0.1 mmol/l $CuCl_2$ solution for a time of 1 minute (S80). The layer stack and the solution are held at room temperature. During this step, copper ions being present in the $CuCl_2$ solution adhere to the surface of the back contact layer.

A second temperature treatment step is performed after removing the layer stack from the $CuCl_2$ solution (S90). The layer stack is held at a temperature of 200° C. for a time period of 15 minutes under atmospheric conditions. This step results in migration of copper ions from the surface of the back contact layer to the interface of the back contact layer with the CdTe layer and slightly into the CdTe layer. Due to providing copper ions after applying the back contact layer instead of providing copper directly onto the surface of the CdTe layer and due to the low thermal budget applied to the layer stack during the second temperature treatment step, copper migration and the amount of copper incorporated into the CdTe layer can be controlled better than in the prior art.

After the second temperature treatment step, a further cleaning step is performed (S100). In this step, the layer stack resulting from the previous processing steps is cleaned by dipping the layer stack into a 100% solution of dimethylformamide for a time of 5 minutes. The dimethylformamide solution rinses off copper ions which did not diffuse into the back contact layer during the second temperature treatment step and simultaneously dissolves any residuals, like compounds of copper and molybdenum, chlorine and molybdenum or other compounds generated during the previous process steps on the surface of the back contact layer.

An artificial aging step, also called Open-Circuit Light Soak, OCLS, is performed after the second cleaning step (S110). This step includes an illumination of the layer stack resulting from the previous process steps for 48 hours with an illuminance of about 35000 lx at a temperature of 75° C. under atmospheric conditions. Due to the furthercleaning step (S100), only copper ions already migrated into the back contact layer or the CdTe layer may now further migrate due to the electrical field inside the CdTe solar cell caused by the illumination. The parameters of this step, i.e. low temperature and low luminance, result in good control of copper migration within the CdTe solar cell and reduce risk of degradation of any layer within the CdTe solar cell.

Subsequent to the artificial aging step, a second cleaning step is performed (S120). Again, a 100% dimethylformamide solution is used to clean the layer stack resulting from the previous processing steps, wherein the layer stack is dipped into the dimethylformamide solution for a time of 5 minutes and subsequently rinsed first with water and second with isopropanol.

All cleaning steps are performed at room temperature if not otherwise mentioned.

FIGS. 2A to 2D show the normalized performance parameters for CdTe solar cells produced by the method according to the application as described above with respect to FIG. 1 versus CdTe solar cells produced by a method according to the prior art. That is, the reference onto which the performance parameters are normalized are performance parameters of CdTe solar cell produced by a method according to the prior art comprising the following steps in the mentioned order: providing a transparent substrate with a transparent conductive layer on top of it, applying a 80 nm thick CdS layer on the transparent conductive layer, applying a 4 μm thick CdTe layer on the CdS layer, applying a crystalline $CdCl_2$ layer on the surface of the CdTe layer, performing a first temperature treatment step at 400° C. for 25 minutes, providing copper to a surface of the CdTe layer by dipping the layer stack resulting from the previous steps into an aqueous 1 mmol/l $CuCl_2$ solution for a time of 1 minute, applying a back contact layer of molybdenum on the surface of the CdTe layer, and performing a second temperature treatment step at 200° C. for 25 minutes. After this treatment, the produced CdTe solar cells were electrically characterized, wherein the obtained values of the parameters are the reference values for all other measurements.

Figure 2A:
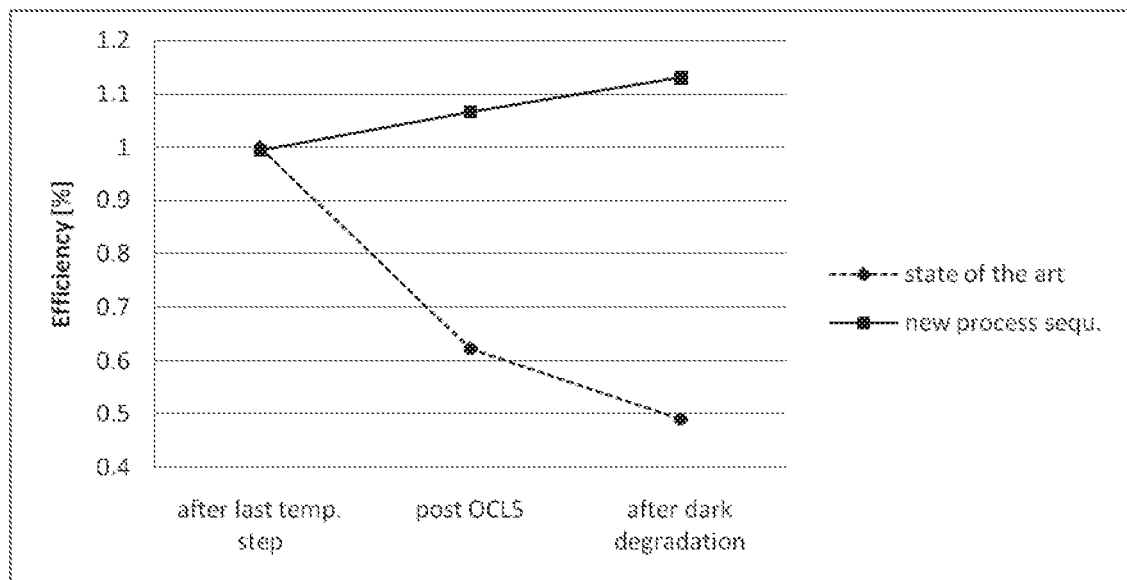
FIGS. 2A to 2D show the normalized performance parameters for CdTe solar cells produced by the method according to the application versus CdTe solar cells produced by a method according to the prior art.
Figure 2B:
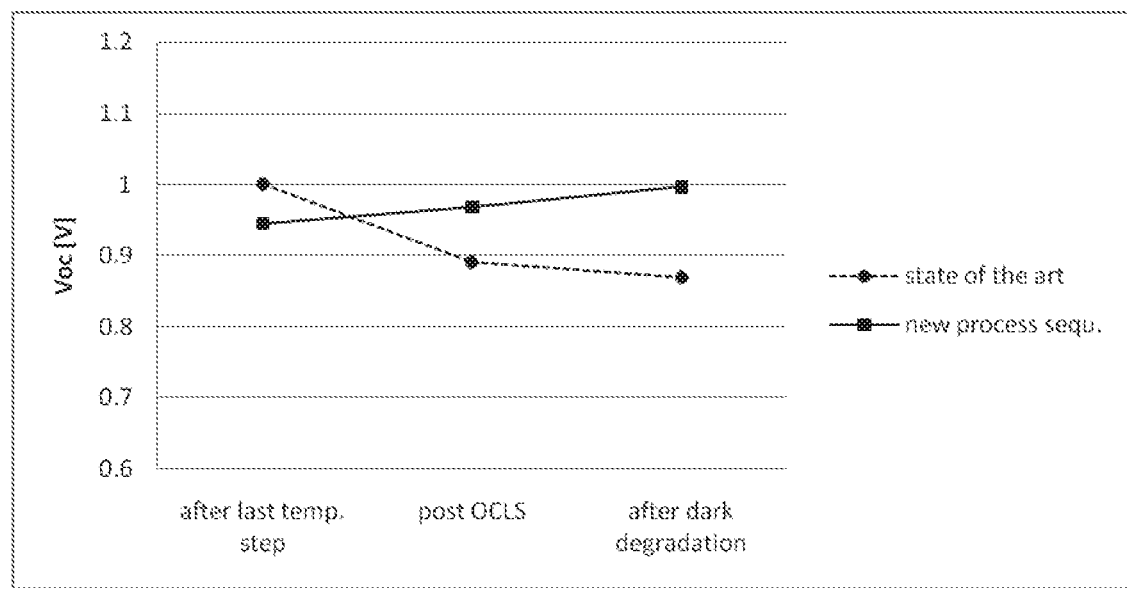
Figure 2C:
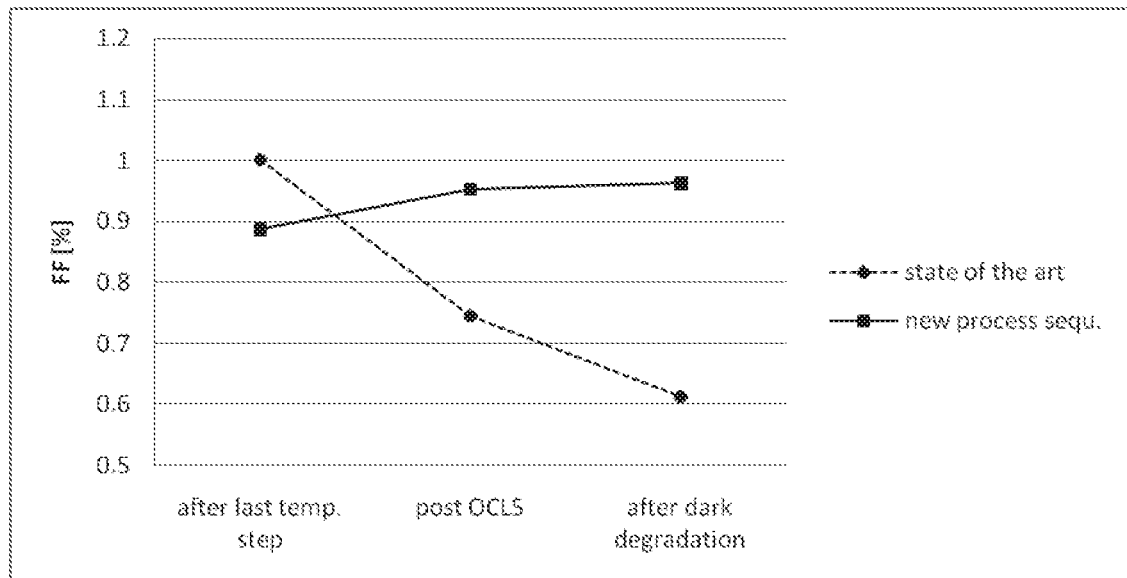
Figure 2D:
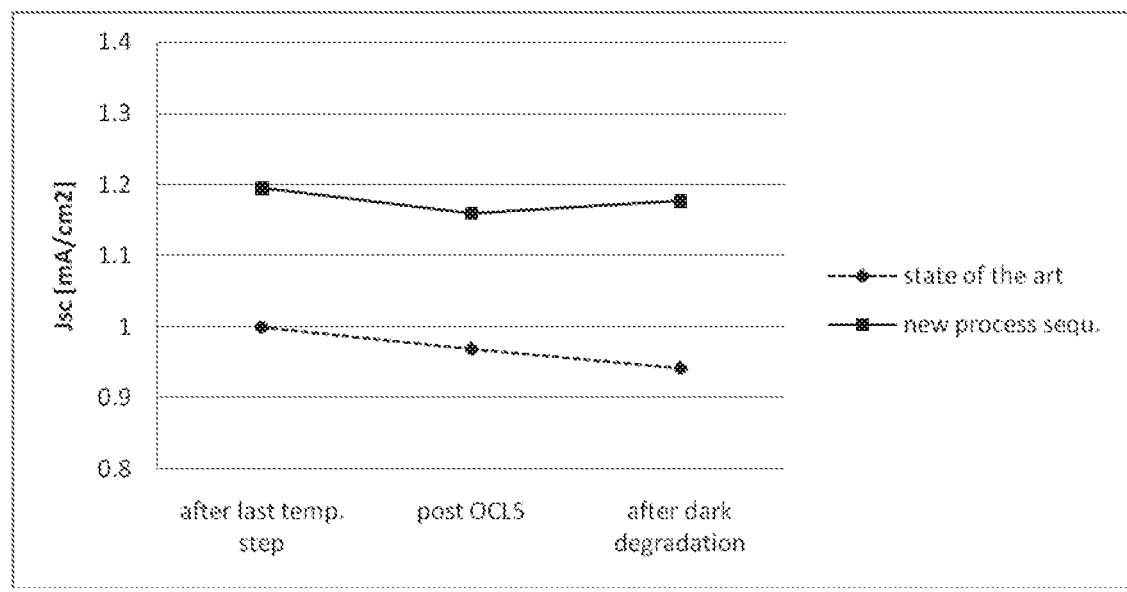

FIG. 2A shows the normalized efficiency ($\eta$), FIG. 2B the normalized open circuit voltage ($V_{oc}$), FIG. 2C the normalized fill factor (FF) and FIG. 2D the normalized short-circuit current ($J_{sc}$) of CdTe solar cells processed with the method according to the application (solid line with rectangular dots) and of CdTe solar cells processed with the above mentioned prior art method (dashed line with diamond dots). For each parameter, three different values are given: First the (normalized) value measured after the last temperature treatment step of the respective process flow, second the (normalized) value measured directly after performing an artificial aging step (OCLS) for 48 hours with an illuminance of about 35000 lx at 75° C. under open-circuit conditions, and third the (normalized) value measured after dark degradation. Dark degradation describes a storage of the CdTe solar cells for 7 days in darkness, i.e. without any illumination, and under open-circuit conditions. For the CdTe solar cells processed with the method according to the application, the third cleaning step according to the application was performed before this last measurement. As can be seen by comparing the third values for each parameter, the combination of all steps and changes with respect to the prior art method as given in the method according to the application results in a great improvement of the characteristics of the CdTe solar cells.

What is claimed is:
1. A method for producing a CdTe thin film solar cell, the method comprising the steps:
providing a transparent substrate with a transparent conducting layer as a front contact on it,
applying a CdS layer on the transparent conducting layer using closed space sublimation technique, wherein the CdS layer is applied with a thickness in the range between 20 nm to 40 nm,
applying a CdTe layer on the CdS layer using closed space sublimation technique, wherein the CdTe layer is applied with a thickness in the range between 3 μm and 5 μm,
applying a crystalline layer of $CdCl_2$ with a thickness in the range of 50 nm to 100 nm on a first surface of the CdTe layer,
performing a first temperature treatment step after applying the $CdCl_2$ layer at a temperature in the range of

380° C. to 430° C. for a time in the range of 15 minutes to 45 minutes under atmospheric conditions, performing a first cleaning step after the first temperature treatment step, wherein the layer stack resulting from the previous processing steps is dipped into a solution of diammonium hydrogen citrate with a concentration in the range of 0.1% to 50% for a time in the range of 15 seconds to 5 minutes, applying a back contact layer on the first surface after the first cleaning step, wherein the back contact layer is applied with a thickness in the range of 200 nm to 400 nm and comprises molybdenum, providing copper ions to a first surface of the back contact layer by dipping a layer stack resulting from the previous process steps into a $CuCl_2$ solution with a concentration in the range of 0.05 mmol/l to 1 mmol/l for a time in the range of 30 seconds to 2 minutes, performing a second temperature treatment step after removing the layer stack from the $CuCl_2$ solution at a temperature in the range of 180° C. to 250° C. for a time period with a duration in the range of 10 minutes to 45 minutes under atmospheric conditions, performing an artificial aging step after performing the second cleaning step, wherein the artificial aging step includes an illumination of the layer stack resulting from the previous process steps for a time in the range of 1 minute to 48 hours with an illuminance in the range of 5000 lx to 200000 lx at a temperature in the range of 70° C. to 80° C. under atmospheric conditions, and performing a second cleaning step after performing the artificial aging step, wherein the layer stack resulting from the previous processing steps is cleaned by dipping the layer stack into a dimethylformamide solution with a concentration in the range of 50% to 100% for a time in the range of 1 minute to 10 minutes and subsequently rinsed with water and isopropanol.

2. The method according to claim 1, further comprising performing a further cleaning step after the second temperature treatment step and before the artificial aging step, wherein the layer stack resulting from the previous processing steps is cleaned by dipping the layer stack into a solution of dimethylformamide with a concentration in the range of 50% to 100% for a time in the range of 1 minute to 10 minutes.

3. The method according to claim 1, characterized in that the layer stack is dipped into a 100%-solution of dimethylformamide for 5 minutes in the second cleaning step or in the further cleaning step.

4. The method according to claim 1, characterized in that the CdS layer is applied with a thickness of 30 nm.

5. The method according to claim 1, characterized in that the CdTe layer is applied with a thickness of 4 μm.

6. The method according to claim 1, characterized in that the crystalline $CdCl_2$ layer is applied with a thickness of 80 nm.

7. The method according to claim 1, wherein the $CdCl_2$ is preferably applied as an aqueous salt solution by roller coating.

8. The method according to claim 1, wherein the first temperature treatment step is performed at a temperature of 410° C. for 25 minutes.

9. The method according to claim 1, wherein the first cleaning step is performed with a 1%-solution of diammonium hydrogen citrate for 1 minute.

10. The method according to claim 1, characterized in that the back contact layer is made of molybdenum and is applied with a thickness of 300 nm.

11. The method according to claim 1, wherein providing copper ions is performed by dipping the layer stack into a 0.1 mmol/l $CuCl_2$ solution for 1 minute.

12. The method according to claim 1, characterized in that the second temperature treatment step is performed at a temperature of 200° C. for 15 minutes.

13. The method according to claim 1, characterized in that, during the artificial aging step, the layer stack is held at a temperature of 75° C., while it is illuminated with an illuminance of about 35000 lx for 48 hours.

14. The method according to claim 2, characterized in that the layer stack is dipped into a 100%-solution of dimethylformamide for 5 minutes in the second cleaning step or in the further cleaning step.

* * * * *